United States Patent
Bazarsky et al.

(10) Patent No.: US 12,001,719 B2
(45) Date of Patent: Jun. 4, 2024

(54) STORAGE MEDIA BASED SEARCH FUNCTION FOR KEY VALUE DATA STORAGE DEVICES

(71) Applicant: Western Digital Technologies, Inc., San Jose, CA (US)

(72) Inventors: Alexander Bazarsky, Holon (IL); David Avraham, Even Yehuda (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 96 days.

(21) Appl. No.: 17/850,352

(22) Filed: Jun. 27, 2022

(65) Prior Publication Data

US 2023/0418519 A1    Dec. 28, 2023

(51) Int. Cl.
    *G06F 3/06*    (2006.01)
(52) U.S. Cl.
    CPC .......... *G06F 3/0659* (2013.01); *G06F 3/0604* (2013.01); *G06F 3/0656* (2013.01); *G06F 3/0679* (2013.01)
(58) Field of Classification Search
    CPC .... G06F 3/0659; G06F 3/0604; G06F 3/0656; G06F 3/0679
    See application file for complete search history.

(56) References Cited

U.S. PATENT DOCUMENTS

| | | | | |
|---|---|---|---|---|
| 5,497,176 A | * | 3/1996 | Sasaki | .................... G06F 3/038 345/173 |
| 11,158,369 B2 | | 10/2021 | Sharon et al. | |
| 11,158,639 B2 | | 10/2021 | Zhu et al. | |
| 2011/0246503 A1 | * | 10/2011 | Bender | .................. G06F 9/546 707/769 |
| 2013/0117255 A1 | * | 5/2013 | Liu | ..................... G06F 16/2456 707/E17.017 |
| 2014/0177310 A1 | * | 6/2014 | Vattikonda | ............. G11C 15/04 365/49.17 |
| 2014/0185348 A1 | * | 7/2014 | Vattikonda | ............. G11C 15/00 365/49.17 |

(Continued)

OTHER PUBLICATIONS

Kim, et al., The Key to Value: Understanding the NVMe Key-Value Standard, Live Website, Sep. 1, 2020, SNIA NSF, Networking Storage, 31 pp.

(Continued)

*Primary Examiner* — Christopher D Birkhimer
(74) *Attorney, Agent, or Firm* — PATTERSON + SHERIDAN, LLP

(57) ABSTRACT

A data storage device includes a memory device and a controller coupled to the memory device. The controller is configured to receive a search command from a host device, where the search command is for value associated with a key value (KV) format having a specific sequence, prepare one or more search buffers and send the one or more search buffers to the memory device, retrieve one or more wordlines having KV pair data associated with the KV format, where the KV pair data includes a key and a value, compare the retrieved one or more wordlines with the one or more search buffers for values having the specific sequence, and provide at least a portion of the value from one or more KV pair data based on the comparing to the host device.

20 Claims, 6 Drawing Sheets

(56) References Cited

U.S. PATENT DOCUMENTS

| | | | |
|---|---|---|---|
| 2015/0006486 A1* | 1/2015 | Lin | G06F 3/061 |
| | | | 707/634 |
| 2015/0235674 A1* | 8/2015 | Chi | G11C 5/04 |
| | | | 365/72 |
| 2016/0277548 A1* | 9/2016 | Ozawa | H04L 1/004 |
| 2019/0238653 A1* | 8/2019 | Syomichev | G06F 3/0656 |
| 2021/0406237 A1* | 12/2021 | Killamsetti | G06F 16/2246 |

OTHER PUBLICATIONS

Adams, NVMe® Base Specification 2.0 Preview, Flash Memory Summit, 2020, NVM Express organization, 20 pp.
Samsung Key Value SSD Enables High Performance Scaling, A Technology Brief by Samsung Memory Solutions Lab, Samsung Electronics, Co. Ltd., 2017, 8 pp.
Martin, et al, NVM Express Technical Proposal for New Feature, Jun. 2020, NVM Express, Inc., 34 pp.

\* cited by examiner

| COMMAND | DESCRIPTION |
|---|---|
| DELETE | DELETE THE KEY AND VALUE ASSOCAITED WITH SPECIFIED KEY |
| LIST | LISTS KEYS THAT EXIST IN A KEY VALUE NAMESPACE STARTING AT A SPECIFIED KEY |
| RETRIEVE | RETRIEVE THE VALUE ASSOCIATED WITH A SPECIFIED KEY |
| EXIST | RETURNS A STATUS INDICATING WHETHER A KEY VALUE EXISTS FOR A SPECIFIED KEY |
| STORE | STORES A KEY VALUE TO A KEY VALUE NAMESPACE |

| KEY 202 |
|---|
| VALUE 204 |

STORAGE MEDIA BASED SEARCH FUNCTION FOR KEY VALUE DATA STORAGE DEVICES

BACKGROUND OF THE DISCLOSURE

Field of the Disclosure

Embodiments of the present disclosure generally relate to data storage devices, such as solid state drives (SSDs), and, more specifically, searching for key value (KV) pair data efficiently.

Description of the Related Art

A KV database works by storing a quantity of user data that is associated with a key that is addressable as a complete entity. Examples of user data that can be stored in a KV database may include photos, records, and files. From a host device point-of-view, the photo, the record, or the file may be retrieved using a single key/address, rather than using multiple addresses that include data of the photo, the record, or the file. The data is stored as unstructured data and may be addressed using a key of variable length. Storage space of a memory device may be allocated for KV pair data in increments of bytes, where a length value of the KV pair data is associated with the necessary storage space to store the KV pair data.

Using a KV database in a data storage device may increase the performance of the data storage device. For example, the number of data transfers/second may be improved because the KV pair data to physical storage location translation layer in the host device may be removed. Furthermore, the number of commands over the bus may be reduced since an entire KV pair data may utilize a single transfer. KV pair data allows access to data on a data storage device using a key rather than a block address.

A search function may be used by many applications in different contexts. For example, both indexed data and non-indexed data may be searched using the search function. Indexed data is prepared in advance using large computations and overprovisioning. Thus, searching through the indexed data may be relatively fast. However, because non-indexed data is not prepared in advance, searching through the non-indexed data may require a large amount of time. In other words, the amount of time to complete a search through indexed data is much less than the amount of time to complete a search through non-indexed data.

Therefore, there is a need in the art for a method to search for sequences in key value (KV) pair data efficiently.

SUMMARY OF THE DISCLOSURE

The present disclosure generally relates to data storage devices, such as solid state drives (SSDs), and, more specifically, searching for key value (KV) pair data efficiently. A data storage device includes a memory device and a controller coupled to the memory device. The controller is configured to receive a search command from a host device, where the search command is for value associated with a key value (KV) format having a specific sequence, prepare one or more search buffers and send the one or more search buffers to the memory device, retrieve one or more wordlines having KV pair data associated with the KV format, where the KV pair data includes a key and a value, compare the retrieved one or more wordlines with the one or more search buffers for values having the specific sequence, and provide at least a portion of the value from one or more KV pair data based on the comparing to the host device.

In one embodiment, a data storage device includes a memory device and a controller coupled to the memory device. The controller is configured to receive a search command from a host device, where the search command is for a value associated with a key value (KV) format having a specific sequence, prepare one or more search buffers and send the one or more search buffers to the memory device, retrieve one or more wordlines having KV pair data associated with the KV format, where the KV pair data includes a key and a value, compare the retrieved one or more wordlines with the one or more search buffers for values having the specific sequence, and provide at least a portion of the value from one or more KV pair data based on the comparing to the host device.

In another embodiment, a data storage device includes a memory device and a controller coupled to the memory device. The controller is configured to generate one or more search buffers to search for a specific sequence of a value, where the specific sequence corresponds to a key value (KV) format in the memory device, where each of the one or more search buffers corresponds with a wordline of the memory device, and where the wordline of the memory device stores a plurality of values, send the generated one or more search buffers to the memory device, and retrieve a portion of the value associated with the specific sequence with a corresponding search buffer of the one or more search buffers based on the comparing, wherein the portion matches the specific sequence. The memory device is configured to store the wordlines that include the value of associated with the specific sequence in a latch of the memory device and compare the wordlines that include the value associated with the specific sequence with a corresponding search buffer of the one or more search buffers.

In another embodiment, a data storage device includes memory means and a controller coupled to the memory means. The controller is configured to receive a search command from a host device for a specific sequence associated with a portion of a value of a key value (KV) pair data from the memory means, where the search command is associated with a KV format, generate a search buffer based on the received search command, retrieve one or more wordlines corresponding to the KV format from the memory device, compare the generated search buffer with the retrieved one or more wordlines, and provide at least a portion of the value from the retrieved one or more wordlines based on the comparing to the host device, where the at least a portion of the value matches the specific command.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is an exemplary illustration of a KV pair data, according to certain embodiments.

FIG. 2B is a table illustrating a command set for a KV database, according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, searching for key value (KV) pair data efficiently. A data storage device includes a memory device and a controller coupled to the memory device. The controller is configured to receive a search command from a host device, where the search command is for a value associated with a key value (KV) format having a specific sequence, prepare one or more search buffers and send the one or more search buffers to the memory device, retrieve one or more wordlines having KV pair data associated with the KV format, where the KV pair data includes a key and a value, compare the retrieved one or more wordlines with the one or more search buffers for values having the specific sequence, and provide at least a portion of the value from one or more KV pair data based on the comparing to the host device.

Figure 1:
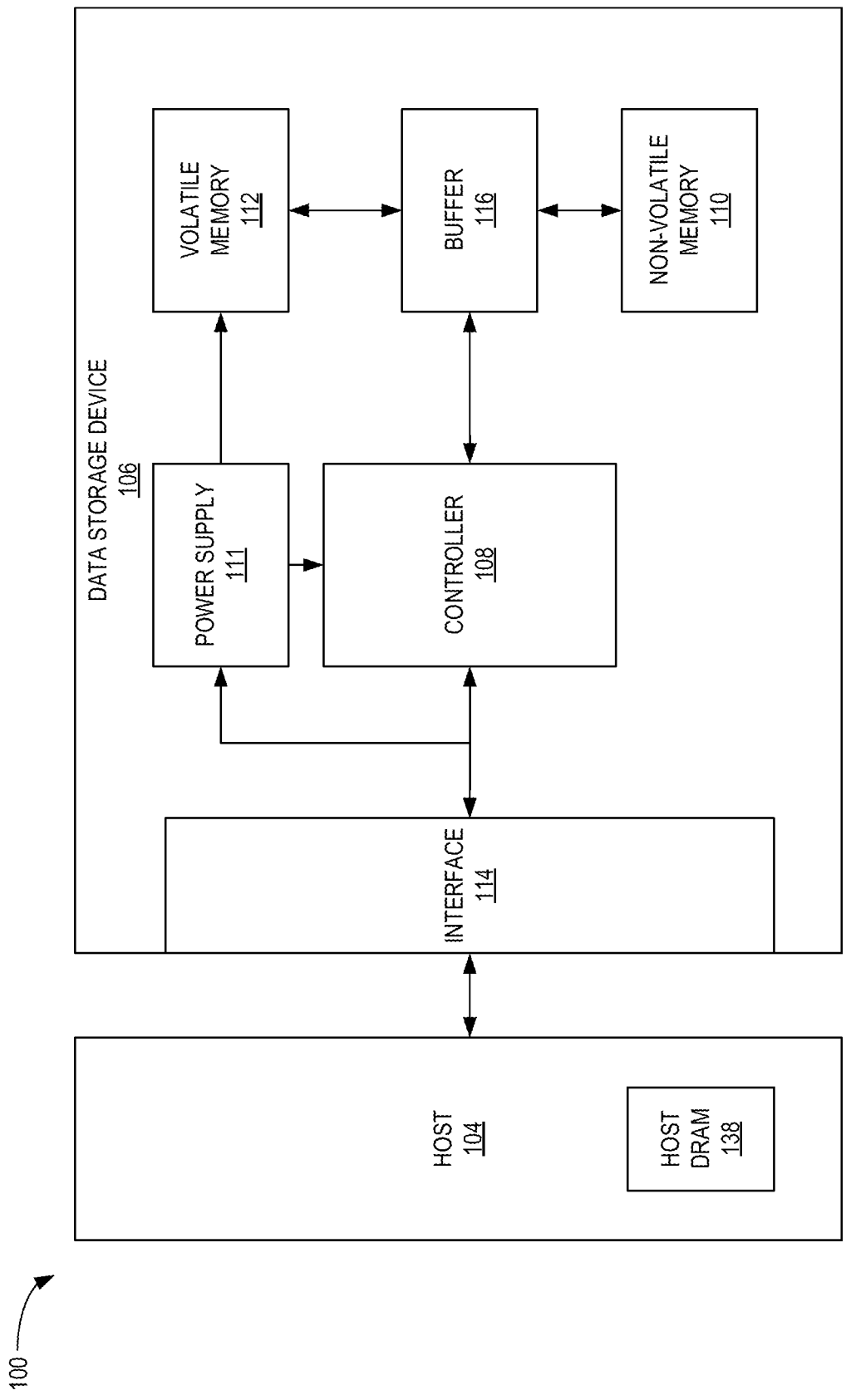
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in an internal memory of the controller 108, which may be SRAM memory, prior to sending the data to the NVM 110.

FIG. 2A is an exemplary illustration of a KV pair data 200, according to certain embodiments. KV pair data 200 includes a key 202 and a value 204, where the data, which may be host data, of the value 204 is addressed by the key 202. The key 202 may have a size of about 1 byte to about 64 bytes and the value 204 may have a size of about 0 bytes to about $2^{32}-1$ bytes. For example, when the value 204 has a size of about 0 bytes, the value 204 is an empty value. It is to be understood that the previously mentioned values are not intended to be limiting, but to provide an example of an embodiment.

FIG. 2B is a table 250 illustrating a command set for a KV database, according to certain embodiments. For exemplary purposes, aspects of the storage system 100 of FIG. 1 may be referenced herein. A KV system may include a command set that includes, in a non-limiting list, a delete command, a list command, a retrieve command, an exist command, and a store command. The delete command may cause the controller 108 to delete the key 202 and value 204 associated with the key 202. The list command may cause the controller 108 to list keys that exist in a KV namespace starting at a specified key. The exist command may cause the controller 108 to return a status indicating whether a KV pair data 200 exists for a specified key to the command generator, such as the host device 104. The store command may cause the controller 108 to store a KV pair data to a KV namespace.

The retrieve command may cause the controller 108 to retrieve the value 204 associated with a specified key from a KV namespace. The length to be retrieved of the KV pair data 200 is specified in the retrieve command and the location to transfer the KV pair data 200 is specified by either a scatter gather list (SGL) pointer or a physical region page (PRP) pointer in the retrieve command. If the specified length in the retrieve command is less than the length of the KV pair data 200 that is being retrieved, then the controller 108 returns the requested amount and the length of the KV pair data 200 to the completion queue. However, if the specified length in the retrieve command is greater than the length of the KV pair data 200 that is being retrieved, then the controller 108 returns the data from the NVM 110 and the length of the KV pair data 200 is returned to the completion queue.

In the KV system, there may be one or more KV formats present, each with a different set of KV sizes and properties. For example, a KV format may refer to a value length of the KV data. The value length may correspond to a type of the host object. For example, large objects, such as large videos, data files, images, music, documents, and the like, may have a size of a few megabytes and smaller objects, such as leaves in larger data structures, log entries, social media applications, internet of things (IoT) services, and the like, may have a size in the tens of bytes. A flash management unit (FMU) size may be driven by different constraints according to the type and amount of error correction code (ECC) used and the physical memory parameters. A plurality of KV pair data that has a smaller value length, where the value length is less than an FMU size, may be grouped and aggregated to the FMU. For example, if a KV pair data has a value length of about 50 bytes and an FMU size is equal to about 4 KB, then about 80 KV pair data having a value length of about 50 bytes each may be stored in each FMU. Therefore, hundreds of KV pair data having a value length of about 50 bytes may be stored in each wordline.

Figure 3:
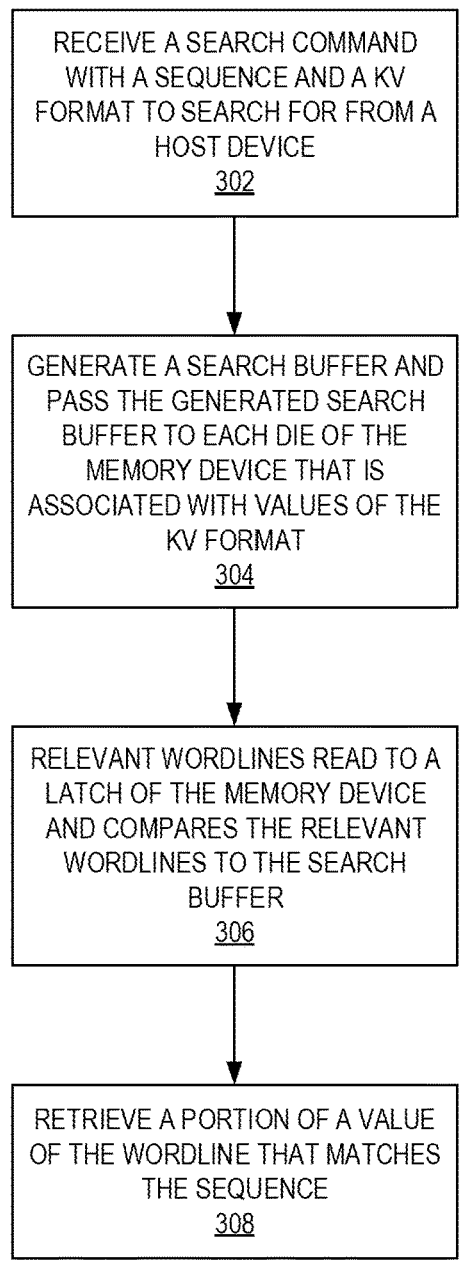
FIG. 3 is a flow diagram illustrating a method of searching for a specific sequence in a value in a memory device, according to certain embodiments.

FIG. 3 is a flow diagram illustrating a method 300 of searching for a specific sequence in a value in a memory device, such as the NVM 110 of FIG. 1, according to certain embodiments. Method 300 may be implemented by a controller, such as the controller 108 of FIG. 1, coupled to the NVM 110, where the NVM 110 may include complementary metal-oxide-semiconductor (CMOS) bonded array (CbA) architecture. The CbA architecture may include a decoder for decoding retrieved data from a memory die coupled to the CbA. For exemplary purposes, aspects of the storage system 100 of FIG. 1 may be referenced herein.

At block 302, the controller 108 receives a search command from the host device 104, where the search command includes a sequence and a respective KV format to search for in the NVM 110. At block 304, the controller 108 generates a search buffer and passes the generated search buffer to each die of the NVM 110 that has values associated with the KV format. It is to be understood that the controller 108 may generate a search buffer for each wordline that includes values associated with the respective KV format. Furthermore, the generated search buffer is programmed to a latch of the NVM 110. The address range associated with the search buffer comprises wordlines that include the values of the respective KV format. The generated search buffer may be specific to the sequence of the search command.

Furthermore, the generated search buffer may include one or more sections, where each section has a size of a value of the respective wordline. In some examples, a value may be split between two wordlines. When a value is split between two wordlines, a generated search buffer for the first wordline will have the portion of the value stored in the first wordline and another generated search buffer for the second wordline will have the remaining portion of the value that is stored in the second wordline.

At block 306, the relevant wordlines are read to the latch of the NVM 110 and compared to the respective generated search buffer. In one example, search sequence may be smaller than the entire value, such that the searching will be completed as a sliding window over the entire size of the section. When a portion of the value is stored in another wordline, the value found that matches the sequence may be stored in the CbA or the volatile memory. The volatile memory may be the buffer 116, the volatile memory 112, or an internal volatile memory of the controller 108, such as SRAM. In another example, the search command may include a flag that indicates which bits of each relevant section is to be searched. For example, the flag may indicate that the first 8 bytes of each section is to be searched for the sequence. Furthermore, the CbA may decode the retrieved wordlines prior to initiating the comparing. Likewise, the CbA may also descramble the data of the retrieved wordlines prior to initiating the comparing. At block 308, the portion or portions of the value of the wordline or wordlines that matches the sequence is retrieved by the controller 108. The controller 108 may set a status of "found" for the relevant portion or portions of the value when the comparison indicates that the relevant portion or portions of the value matches the sequence of the search command.

Figure 4:
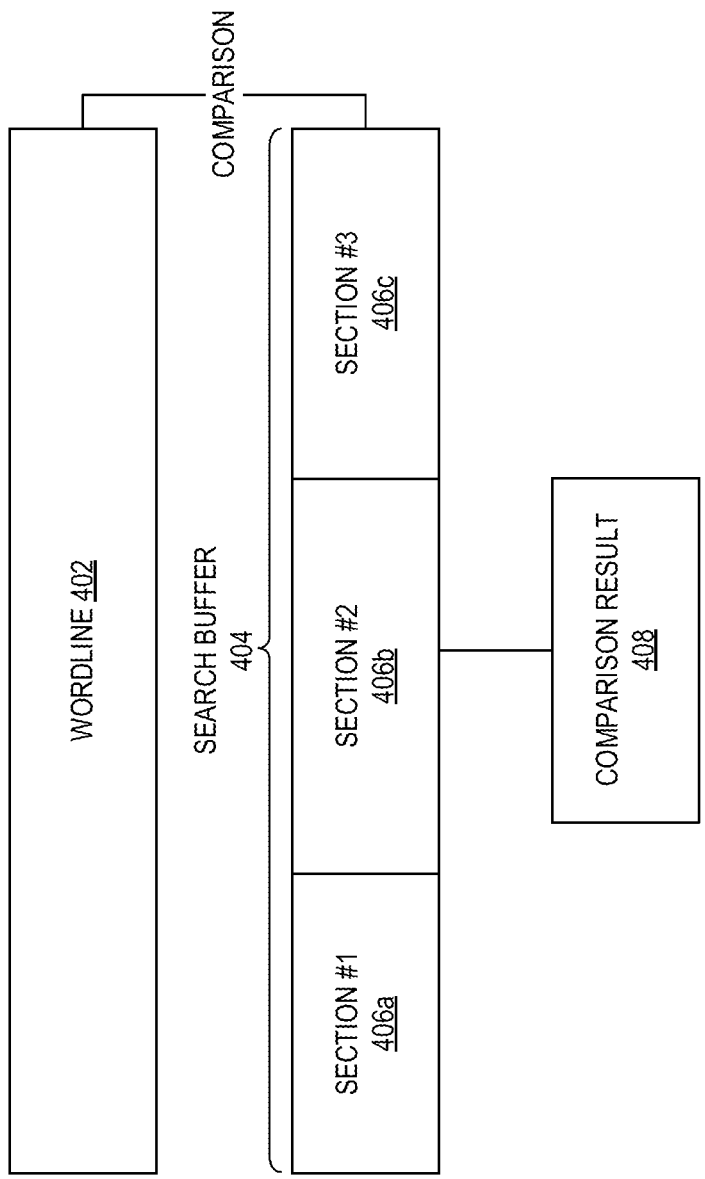
FIG. 4 is an exemplary illustration of searching for a specific sequence in a value in a memory device, according to certain embodiments.

FIG. 4 is an exemplary illustration of searching for a specific sequence in a value in a memory device, such as the NVM 110 of FIG. 1, according to certain embodiments. Method 300 may be used to retrieve the specific sequence from a value in the NVM 110. The wordline 402 includes values having a KV format that matches the KV format of the search command. The search buffer 404 is generated in response to receiving the search command, where each section of a plurality of sections 406a-406c corresponds to a value of the wordline 402. For example, a first section 406a corresponds with a first value of the wordline 402, a second section 406b corresponds with a second value of the wordline 402, and the third section 406c corresponds with a third value of the wordline 402. When method 300 is applied, the wordline 402 is compared with the search buffer 404 section by section, where a comparison result 408 is outputted. The comparison result 408 may either be a "found" status, if the comparison indicates that a portion or portions of a value (i.e., a section) matches the specific sequence, or a "not found" status, if the comparison indicates that the values of the wordline 402 have any portions that match the specific sequence.

Figure 5:
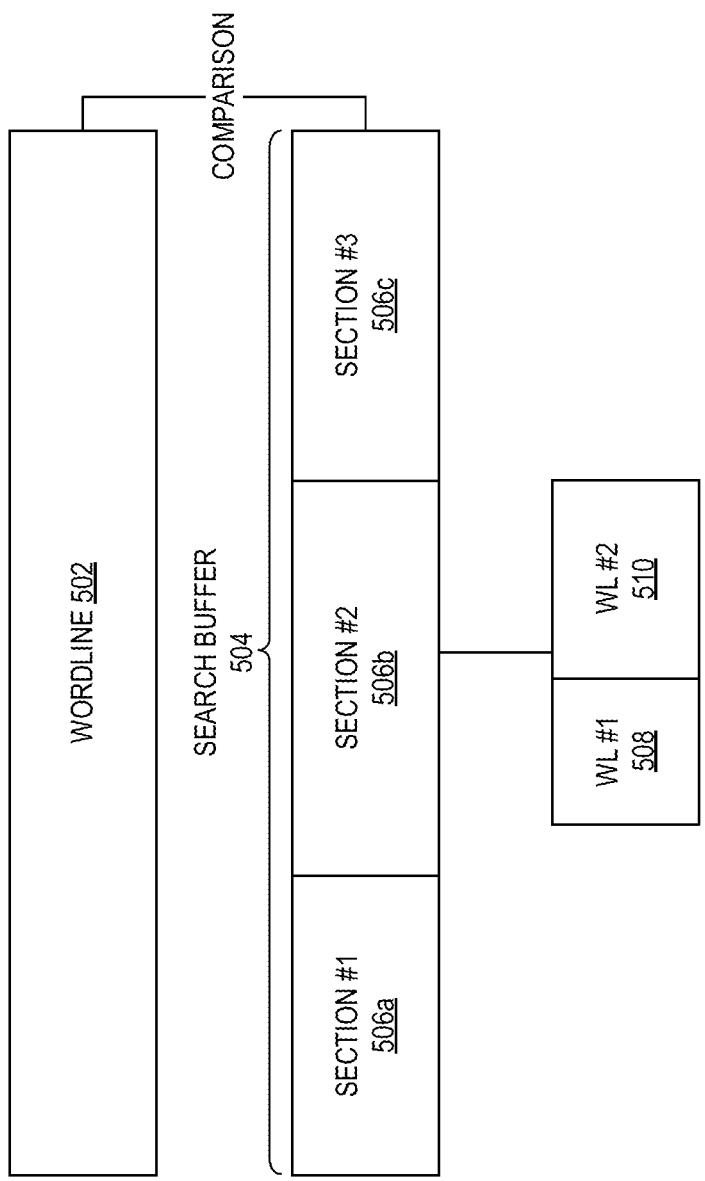
FIG. 5 is an exemplary illustration of searching for a specific sequence in a value in a memory device, according to certain embodiments.

FIG. 5 is an exemplary illustration of searching for a specific sequence in a value in a memory device, such as the NVM 110 of FIG. 1, according to certain embodiments. Method 300 may be used to retrieve the specific sequence from a value in the NVM 110. The wordline 502 includes values having a KV format that matches the KV format of the search command. The search buffer 504 is generated in response to receiving the search command, where each section of a plurality of sections 506a-506c corresponds to a value of the wordline 502. For example, a first section 506a corresponds with a first value of the wordline 502, a second section 506b corresponds with a second value of the wordline 502, and the third section 506c corresponds with a portion of a third value of the wordline 502, where a remaining portion of the third value is stored on an another adjacent and/or sequential wordline and is associated with another search buffer. When method 300 is applied, the wordline 502 is compared with the search buffer 504 section by section, where a comparison result of the first wordline 508 is outputted and stored, including the portion of the value, in the CbA or the volatile memory. In the current example, the "found" status is associated with the third section 506c. Because the remaining portion of the third value associated with the third section 506c is on a second wordline, the second wordline is compared to a respective search buffer. Thus, when a comparison result of the second wordline 510 is outputted, including the remaining portion of the value, the stored portion of the third value from the first wordline may be aggregated with the remaining portion of the value and provided to the host device 104.

Figure 6:
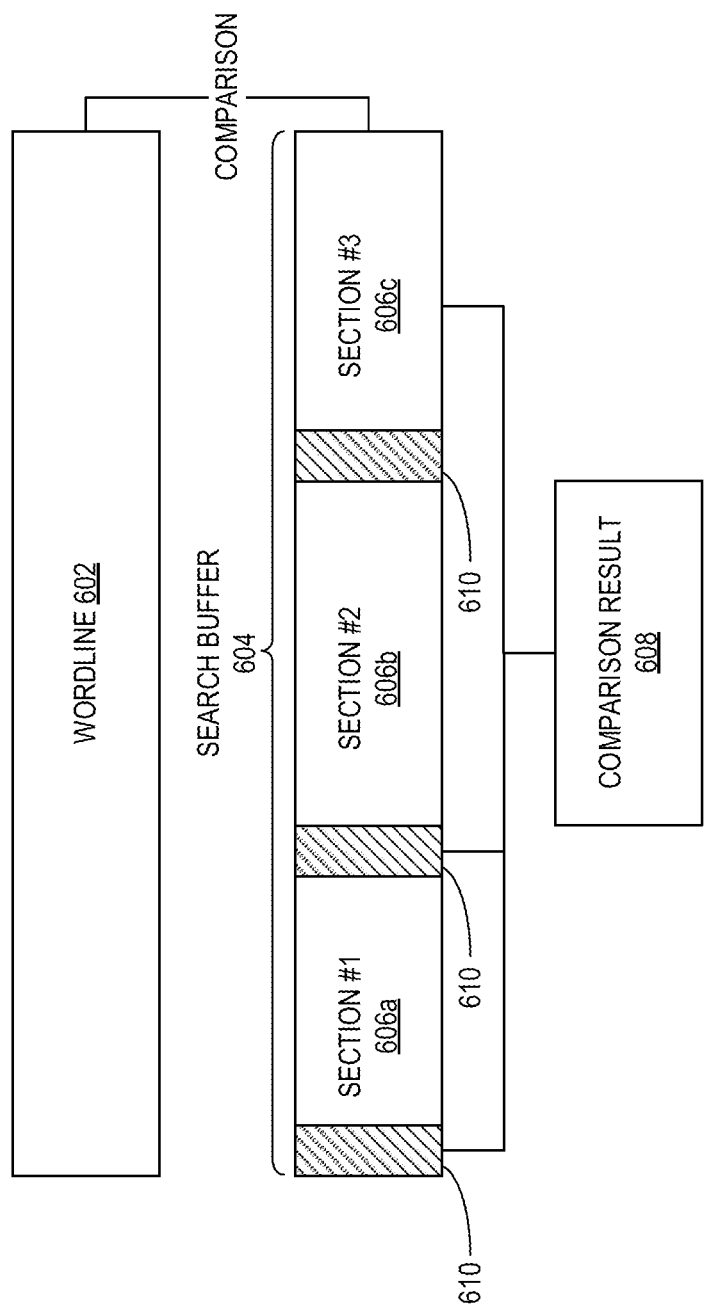
FIG. 6 is an exemplary illustration of searching for a specific sequence in a value in a memory device, according to certain embodiments.

FIG. 6 is an exemplary illustration of searching for a specific sequence in a value in a memory device, such as the NVM 110 of FIG. 1, according to certain embodiments. Method 300 may be used to retrieve the specific sequence from a value in the NVM 110. The wordline 602 includes values having a KV format that matches the KV format of the search command. The search buffer 604 is generated in response to receiving the search command, where each section of a plurality of sections 606a-606c corresponds to a value of the wordline 602. For example, a first section 606a corresponds with a first value of the wordline 602, a second section 606b corresponds with a second value of the wordline 602, and the third section 606c corresponds with a third value of the wordline 602. When method 300 is applied, the wordline 602 is compared with a number of bytes 610 of each section of the search buffer 604, where a comparison result 608 is outputted. The number of bytes 610 may be indicated by a flag that is included in the search command. For example, the number of bytes 610 may be 8 bytes. The comparison result 608 may either be a "found" status, if the comparison indicates that a portion or portions of a value (i.e., a section) matches the specific sequence, or a "not found" status, if the comparison indicates that the values of the wordline 602 do not have any portions that match the specific sequence.

By using a storage media based search function for key value data storage devices, searching for a particular sequence of a KV format may be improved, thus, lowering latency associated with completing a search command.

In one embodiment, a data storage device includes a memory device and a controller coupled to the memory device. The controller is configured to receive a search command from a host device, where the search command is for value associated with a key value (KV) format having a specific sequence, prepare one or more search buffers and send the one or more search buffers to the memory device, retrieve one or more wordlines having KV pair data associated with the KV format, where the KV pair data includes a key and a value, compare the retrieved one or more wordlines with the one or more search buffers for values having the specific sequence, and provide at least a portion of the value from one or more KV pair data based on the comparing to the host device.

The memory device includes complementary metal-oxide-semiconductor (CMOS) bonded array (CbA) architecture. The CbA is configured to perform a decoding operation on the retrieved one or more wordlines having KV pair data associated with the KV format. The one or more search buffers is sent to a latch of the memory device. The retrieving is done in parallel on each die of the memory device. The one or more search buffers comprises two or more sections, and wherein each section has a size equal to a size of a value corresponding to KV pair data of the retrieved one or more wordlines. The controller is further configured to search each section of the one or more search buffers, where searching a section of the one or more search buffers includes searching a sliding window over an entirety of the section. The search command defines a flag. The flag indicates which part of each section to search. The controller is further configured to store a portion of a first value of a first wordline in a buffer, where the first value is stored between the first wordline and a second wordline sequential to the first wordline, and where the portion of the first value matches the specific sequence, and search the second wordline for a remaining portion of the first value that matches the specific sequence. The controller is further configured to provide the portion of the first value of the first wordline from the buffer and the remaining portion of the first value of the second wordline from the second wordline to the host device.

In another embodiment, a data storage device includes a memory device and a controller coupled to the memory device. The controller is configured to generate one or more search buffers to search for a specific sequence of a value, where the specific sequence corresponds to a key value (KV) format in the memory device, where each of the one or more search buffers corresponds with a wordline of the memory device, and where the wordline of the memory device stores a plurality of values, send the generated one or more search buffers to the memory device, and retrieve a portion of the value associated with the specific sequence with a corresponding search buffer of the one or more search buffers based on the comparing, wherein the portion matches the specific sequence. The memory device is configured to store the wordlines that include the value of associated with the specific sequence in a latch of the memory device and compare the wordlines that include the value associated with the specific sequence with a corresponding search buffer of the one or more search buffers.

The wordlines that include the value associated with the specific sequence is decoded prior to the comparing. A complementary metal-oxide-semiconductor (CMOS) bonded array (CbA) chip is configured to perform the decoding. The CbA chip is coupled to a memory die comprising the wordlines that include the value associated with the specific sequence. The wordlines that include the value associated with the specific sequence are not decoded prior to the comparing. The retrieving comprises storing the portion of the value associated with the specific sequence in volatile memory. A search buffer includes a plurality of sections, and wherein each section of the plurality of sections corresponds to a value of the wordline. The comparing is either performed on less than an entirety of the wordline, where the less than an entirety of the wordline corresponds to a first number of bits of each section of the plurality of sections, or the comparing is performed using a sliding window on each section of the plurality of sections.

In another embodiment, a data storage device includes memory means and a controller coupled to the memory means. The controller is configured to receive a search command from a host device for a specific sequence associated with a portion of a value of a key value (KV) pair data from the memory means, where the search command is associated with a KV format, generate a search buffer based on the received search command, retrieve one or more wordlines corresponding to the KV format from the memory device, compare the generated search buffer with the retrieved one or more wordlines, and provide at least a portion of the value from the retrieved one or more wordlines based on the comparing to the host device, where the at least a portion of the value matches the specific command. The memory means is configured to perform the retrieving and the comparing.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
receive a search command from a host device, wherein the search command is for value associated with a key value (KV) format having a specific sequence;
prepare one or more search buffers and send the one or more search buffers to the memory device;
retrieve one or more wordlines having KV pair data associated with the KV format, wherein the KV pair data includes a key and a value;

compare the retrieved one or more wordlines with the one or more search buffers for values having the specific sequence; and provide at least a portion of the value from one or more KV pair data based on the comparing to the host device.

2. The data storage device of claim 1, wherein the memory device includes complementary metal-oxide-semiconductor (CMOS) bonded array (CbA) architecture.

3. The data storage device of claim 2, wherein the CbA is configured to perform a decoding operation on the retrieved one or more wordlines having KV pair data associated with the KV format.

4. The data storage device of claim 1, wherein the one or more search buffers is sent to a latch of the memory device.

5. The data storage device of claim 1, wherein the retrieving is done in parallel on each die of the memory device.

6. The data storage device of claim 1, wherein the one or more search buffers comprises two or more sections, and wherein each section has a size equal to a size of a value corresponding to KV pair data of the retrieved one or more wordlines.

7. The data storage device of claim 6, wherein the controller is further configured to search each section of the one or more search buffers, wherein searching a section of the one or more search buffers comprises searching a sliding window over an entirety of the section.

8. The data storage device of claim 6, wherein the search command defines a flag, and wherein the flag indicates which part of each section to search.

9. The data storage device of claim 6, wherein the controller is further configured to:

store a portion of a first value of a first wordline in a buffer, wherein the first value is stored between the first wordline and a second wordline sequential to the first wordline, and wherein the portion of the first value matches the specific sequence; and search the second wordline for a remaining portion of the first value that matches the specific sequence.

10. The data storage device of claim 9, wherein the controller is further configured to provide the portion of the first value of the first wordline from the buffer and the remaining portion of the first value of the second wordline from the second wordline to the host device.

11. A data storage device, comprising:

a memory device; and a controller coupled to the memory device, wherein the controller is configured to:

generate one or more search buffers to search for a specific sequence of a value, wherein the specific sequence corresponds to a key value (KV) format in the memory device, wherein each of the one or more search buffers corresponds with a wordline of the memory device, and wherein the wordline of the memory device stores a plurality of values;

send the generated one or more search buffers to the memory device, wherein the memory device is configured to:

store the wordlines comprising the value associated with the specific sequence in a latch of the memory device; and compare the wordlines comprising the value associated with the specific sequence with a corresponding search buffer of the one or more search buffers; and retrieve a portion of the value associated with the specific sequence with a corresponding search buffer of the one or more search buffers based on the comparing, wherein the portion matches the specific sequence.

12. The data storage device of claim 11, wherein the wordlines comprising the value associated with the specific sequence is decoded prior to the comparing.

13. The data storage device of claim 12, wherein a complementary metal-oxide-semiconductor (CMOS) bonded array (CbA) chip is configured to perform the decoding.

14. The data storage device of claim 13, wherein the CbA chip is coupled to a memory die comprising the wordlines comprising the value associated with the specific sequence.

15. The data storage device of claim 11, wherein the wordlines comprising the value associated with the specific sequence are not decoded prior to the comparing.

16. The data storage device of claim 11, wherein the retrieving comprises storing the portion of the value associated with the specific sequence in volatile memory.

17. The data storage device of claim 11, wherein a search buffer includes a plurality of sections, and wherein each section of the plurality of sections corresponds to a value of the wordline.

18. The data storage device of claim 17, wherein the comparing is either:

performed on less than an entirety of the wordline, wherein the less than an entirety of the wordline corresponds to a first number of bits of each section of the plurality of sections; or the comparing is performed using a sliding window on each section of the plurality of sections.

19. A data storage device, comprising:

memory means; and a controller coupled to the memory means, wherein the controller is configured to:

receive a search command from a host device for a specific sequence associated with a portion of a value of a key value (KV) pair data from the memory means, wherein the search command is associated with a KV format;

generate a search buffer based on the received search command;

retrieve one or more wordlines corresponding to the KV format from the memory means;

compare the generated search buffer with the retrieved one or more wordlines; and provide at least a portion of the value from the retrieved one or more wordlines based on the comparing to the host device, wherein the at least a portion of the value matches the specific command.

20. The data storage device of claim 19, wherein the controller is configured to perform decoding prior to the comparing.

* * * * *